United States Patent
Teskey et al.

(10) Patent No.: US 9,804,007 B2
(45) Date of Patent: Oct. 31, 2017

(54) DEVICE AND METHOD FOR SENSOR CALIBRATION

(71) Applicant: INVENSENSE, INC., San Jose, CA (US)

(72) Inventors: Wesley James Emmanouel Teskey, San Jose, CA (US); Nim Hak Tea, Cupertino, CA (US)

(73) Assignee: Invensense, Inc., San Jose, CA (US)

( * ) Notice: Subject to any disclaimer, the term of this patent is extended or adjusted under 35 U.S.C. 154(b) by 194 days.

(21) Appl. No.: 14/578,312

(22) Filed: Dec. 19, 2014

(65) Prior Publication Data

US 2016/0178415 A1 Jun. 23, 2016

(51) Int. Cl.
*G01D 18/00* (2006.01)
*B81B 7/00* (2006.01)
*B81C 99/00* (2010.01)

(52) U.S. Cl.
CPC ......... *G01D 18/008* (2013.01); *B81B 7/0087* (2013.01); *B81C 99/003* (2013.01)

(58) Field of Classification Search
CPC .... G01D 18/008; B81B 7/0087; B81C 99/003
USPC .......................................................... 73/1.01
See application file for complete search history.

(56) References Cited

U.S. PATENT DOCUMENTS

| 2006/0289415 A1* | 12/2006 | Muehlheim | B81B 7/0012 219/209 |
| 2008/0140331 A1* | 6/2008 | Kalinin | G01D 18/008 702/88 |
| 2009/0049907 A1* | 2/2009 | Wu | G01F 1/6845 73/204.26 |
| 2016/0178657 A9* | 6/2016 | Karahan | G01P 21/00 73/1.38 |

FOREIGN PATENT DOCUMENTS

DE 102013211693 * 7/2014 ............ G01C 9/06

OTHER PUBLICATIONS

PCT International Search Report PCT/US2015/066946 dated Mar. 4, 2016.
PCT International Written Opinion PCT/US2015/066946 dated Mar. 4, 2016.

* cited by examiner

*Primary Examiner* — Daniel S Larkin
(74) *Attorney, Agent, or Firm* — Minisandram Law Firm; Raghunath S. Minisandram

(57) ABSTRACT

A device and method for a MEMS device with at least one sensor is disclosed. A thermal element is disposed adjacent the MEMS device to selectively adjust a temperature of the MEMS device. A calibration operation is initiated for the sensor to determine a correction value to be applied to the sensor measurement based on the temperature. The correction value is stored.

26 Claims, 8 Drawing Sheets

DEVICE AND METHOD FOR SENSOR CALIBRATION

RELATED APPLICATION

None

TECHNICAL FIELD

The present invention relates generally to microelectromechanical systems (MEMS) device and more particularly, to calibration of sensors in a MEMS device.

DESCRIPTION OF RELATED ART

MEMS devices are formed using various semiconductor manufacturing processes. MEMS devices may have fixed and movable portions. MEMS devices may include one or more MEMS sensors. MEMS sensors need to be calibrated for one or more parameters. MEMS devices may sometimes be subjected to unwanted external influences. Sometimes, unwanted external influence may render the calibration of the MEMS sensors less reliable or in some cases unusable. Further, the external influence may change based on the environment the MEMS device is subjected to. It may be beneficial to periodically calibrate one or more parameters of the MEMS sensors in a MEMS device.

With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment a device with a MEMS device with at least one sensor is disclosed. A thermal element is disposed adjacent the MEMS device to selectively adjust a temperature of the MEMS device.

In yet another embodiment, a method is disclosed. The method includes providing a MEMS device with at least one sensor. A thermal element is disposed adjacent the MEMS device. The thermal element is selectively energized to adjust a temperature of the MEMS device. A calibration operation for the sensor is initiated to determine a correction value to be applied to the sensor measurement based on the temperature. The correction value is stored.

This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following Figures.

DETAILED DESCRIPTION

To facilitate an understanding of the adaptive aspects of the present disclosure, exemplary device and method for MEMS device calibration is described. The specific construction and operation of the adaptive aspects of the device and method for MEMS device calibration of the present disclosure are described with reference to an exemplary device with a MEMS device.

Figure 1:
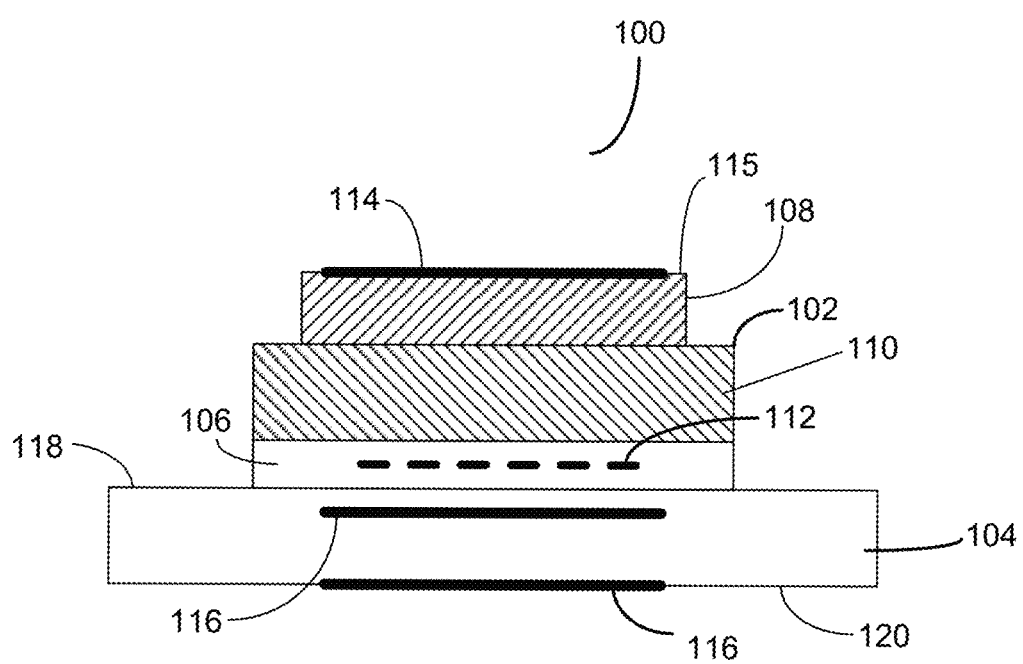
FIG. 1 shows an example device with a MEMS device, according to one aspect of the present disclosure.

FIG. 1 shows a device 100, with a MEMS device 102 and a circuit board 104. An adhesive layer 106 attaches the MEMS device 102 to the circuit board 104. The MEMS device 102 includes a device layer 108 and an IC layer 110. A sensor (not shown) is formed in the MEMS device 102. In some examples, sensor may be formed on the device layer 108. An example MEMS device 102 with a sensor will be later described in detail.

In one example, a thermal element 112 is disposed adjacent the MEMS device 102. The thermal element 112 when energized, is selectively configured to change the temperature of the MEMS device 102. For example, the thermal element 112 may be selectively energized to adjust the temperature of the MEMS device 102. In some examples, a thermal sensor (not shown) may be disposed in the MEMS device 102 to monitor the temperature of the MEMS device 102 so as to adjust the temperature of the MEMS device 102 to a predetermined temperature.

In one example, the thermal element 112 is disposed in the adhesive layer 106. In some examples, a device thermal spreader 114 may be disposed over the MEMS device 102. The device thermal spreader 114 may be disposed about a top surface 115 of the MEMS device 102. The device thermal spreader 114 may be a thermally conductive material. The device thermal spreader 114 may conduct heat and substantially maintain a uniform temperature about the top surface of the MEMS device 102.

In some examples, one or more board thermal spreader 116 may be disposed about the circuit board 104. The board thermal spreader 116 may be a thermally conductive material. The board thermal spreader 116 may conduct heat and substantially maintain a uniform temperature about the circuit board 104. In some examples, the circuit board 104 may be a laminate board with a plurality of layers. One or more layers of the circuit board 104 may be selectively configured as board thermal spreader 116. In some examples, at least a pair of board thermal spreaders 116 may be disposed about the circuit board 104. For example, at least one of the board thermal spreaders 116 may be disposed closer to a top surface 118 of the circuit board 104 and another one of the board thermal spreaders 116 may be disposed closer to a bottom surface 120 of the circuit board 104.

Figure 2:
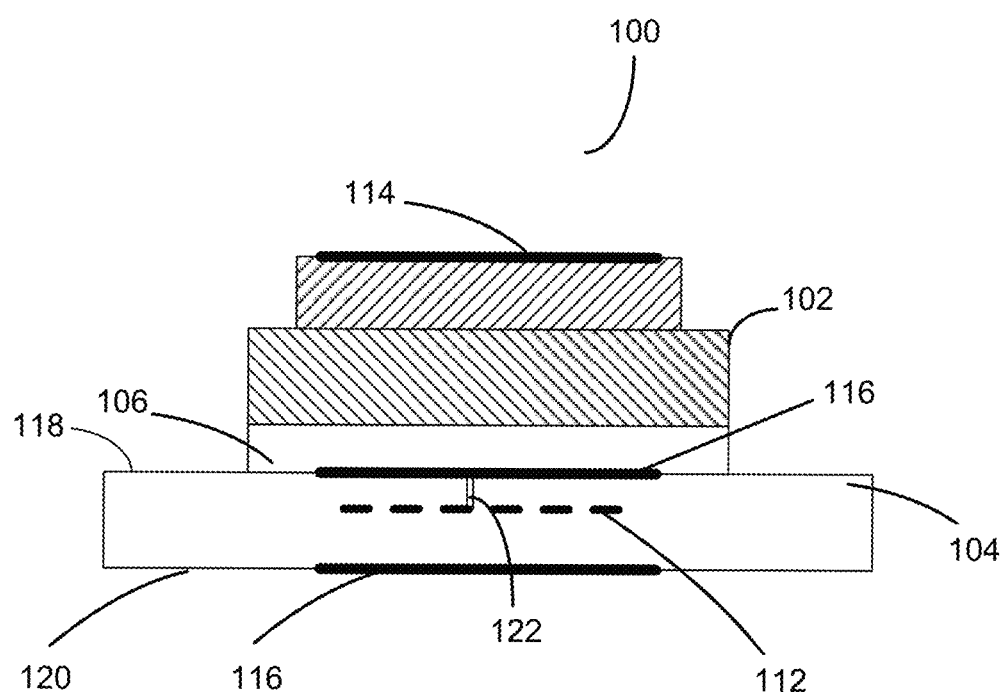
FIG. 2 shows another example device with a MEMS device, according to another aspect of the present disclosure.

Now, referring to FIG. 2, yet another example device 100 with MEMS device 102 is shown. In this example, the adhesive layer 106 attaches the MEMS device 102 to the circuit board 104. The thermal element 112 is disposed within the circuit board 104. In some examples, the circuit board 104 may be a laminate board with a plurality of layers and at least one layer is configured to be a thermal element 112. In some examples, at least one board thermal spreader 116 may be disposed about the circuit board 104. In some examples, at least a pair of board thermal spreaders 116 may be disposed about the circuit board 104. The thermal element 112 may be disposed between the pair of board thermal spreaders 116. In some examples, one or more via 122 may thermally couple the thermal element 112 to a board thermal spreader 116. For example, via 122 may be thermally conductive and may be coupled to board thermal spreader 116 disposed about the top surface 118 of the circuit board 104. In some examples, via 122 may be selectively disposed and coupled to the board thermal spreader 116 so as to assist in uniform thermal transfer to the board thermal spreader 116. Although the board thermal spreaders 116 are shown to be disposed about the top surface 118 and bottom surface 120 of the circuit board 104, as one skilled in the art appreciates, one or more layers within the circuit board 104 may be configured as board thermal spreaders 116. In some examples, a device thermal spreader 114 may be disposed over the MEMS device 102.

Figure 3:
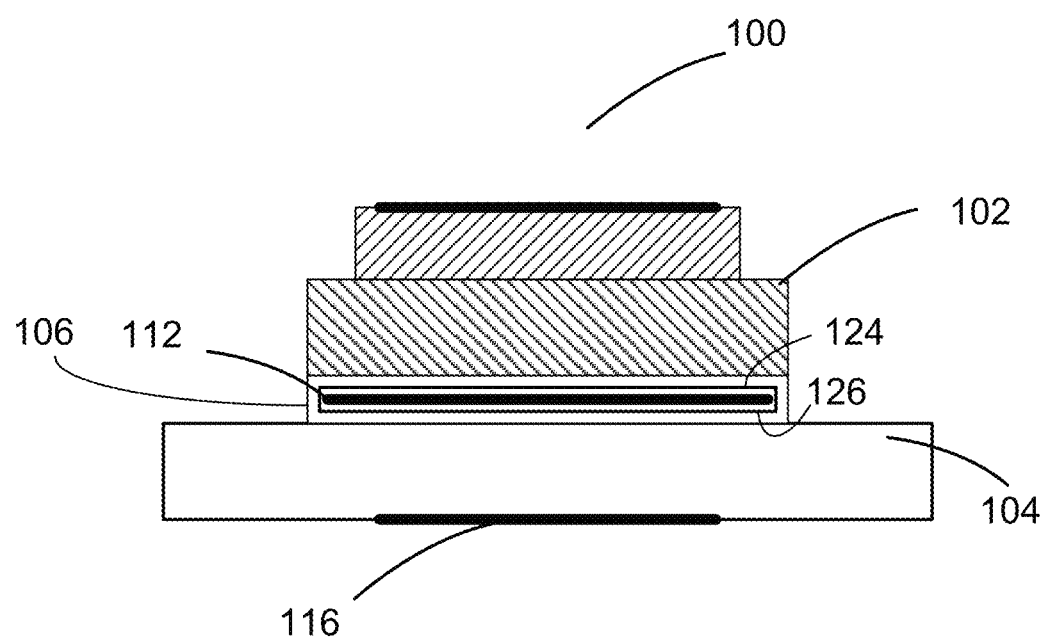
FIG. 3 shows yet another example device with a MEMS device, according to yet another aspect of the present disclosure.

Now, referring to FIG. 3, yet another example device 100 is shown. In this example, thermal element 112 may be configured to selectively heat and selectively cool the MEMS device 102. For example, the thermal element 112 may be a peltier thermal element, which may be configured to selectively heat or selectively cool the MEMS device 102. As one skilled in the art appreciates, a peltier thermal element 112 may have a first surface 124 and a second surface 126. And, when the peltier thermal element 112 is selectively energized, as the temperature of the first surface 124 decreases, the temperature of the second surface 126 correspondingly increases. So, a provision has to be made to remove or dissipate the heat from the second surface 126. In some examples, a board thermal spreader 116 may be configured to dissipate the heat from the second surface 126. In some examples, one or more via (not shown) may be used to thermally couple the second surface 126 to the board thermal spreader 116. In some examples, the peltier thermal element 112 may be disposed in an adhesive layer 106.

Figure 4A:
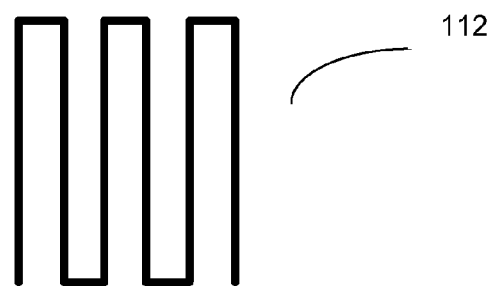
FIG. 4A shows an example configuration of a thermal element, according to an aspect of the present disclosure.

Now, referring to FIG. 4A, an example configuration of the thermal element 112 is shown. In this example, the thermal element 112 has a meander heater pattern. The thermal element 112 may be made up of an alloy of nickel and chromium. When a current is passed through the thermal element 112, the thermal element 112 generates heat.

Figure 4B:
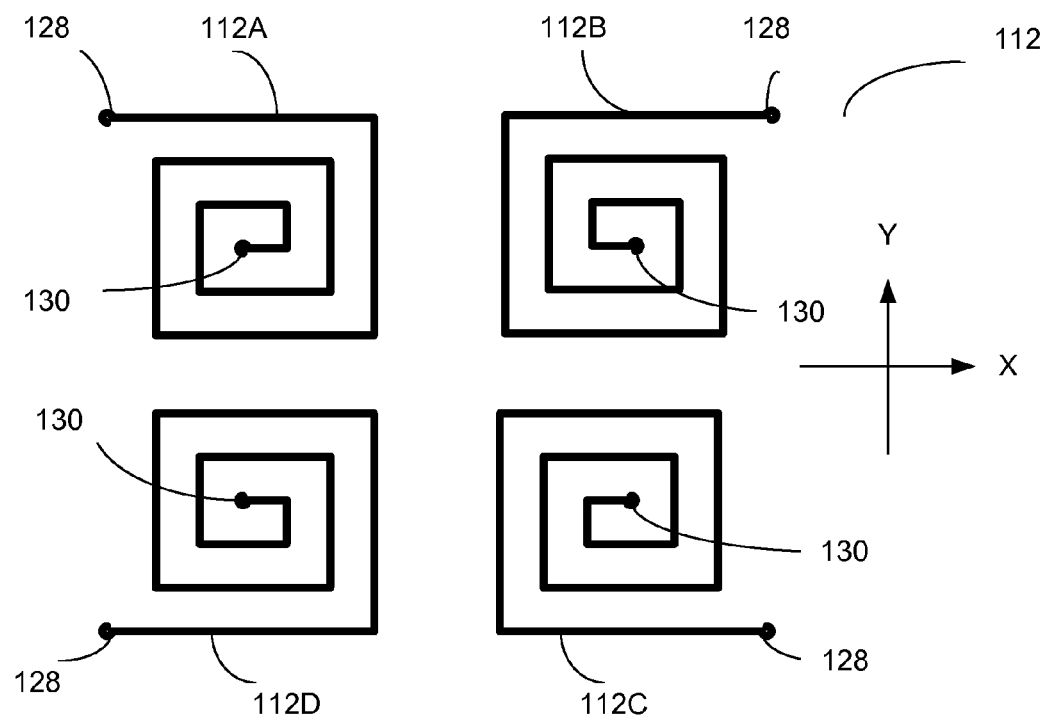
FIG. 4B shows another example configuration of a thermal element, according to an aspect of the present disclosure.

Now, referring to FIG. 4B, another example configuration of the thermal element 112 is shown. In this example, a plurality of thermal sub-elements 112A-112D form the thermal element 112. In this example, the plurality of thermal sub-elements 112A-112D are symmetrical about an X axis and a Y axis, where the Y axis is orthogonal to the X axis. The thermal sub-elements 112A-112D may have a first end 128 and a second end 130. In one example, the thermal elements 112A-112D may be disposed within a circuit board, for example, as previously described with reference to FIG. 2.

In some examples, the second end 130 of each of the thermal sub-elements 112A-112D may be thermally coupled to a board thermal spreader, for example, a board thermal spreader 116 disposed over a top surface 118 of the circuit board 104 as shown in FIG. 2. In some examples, a plurality of thermally conductive via 122 may thermally couple the second end 130 of the thermal sub-element 112 to the board thermal spreader 116 disposed over a top surface 118 of the circuit board 104 as shown in FIG. 2. As one skilled in the art appreciates, by disposing the thermal sub-elements 112A-112D symmetrically about the X axis and the Y axis and coupling the second end 130 of each of the thermal sub-elements 112A-112D to the board thermal spreader 116, board thermal spreader 116 may maintain a substantially uniform temperature about its surface. The thermal elements 112A-112D may be made up of an alloy of nickel and chromium. When a current is passed through the thermal elements 112A-112D, the thermal elements 112A-112D generate heat. In one example, the thermal elements 112A-112D may be disposed within a circuit board, for example, as previously described with reference to FIG. 2.

Figure 5:
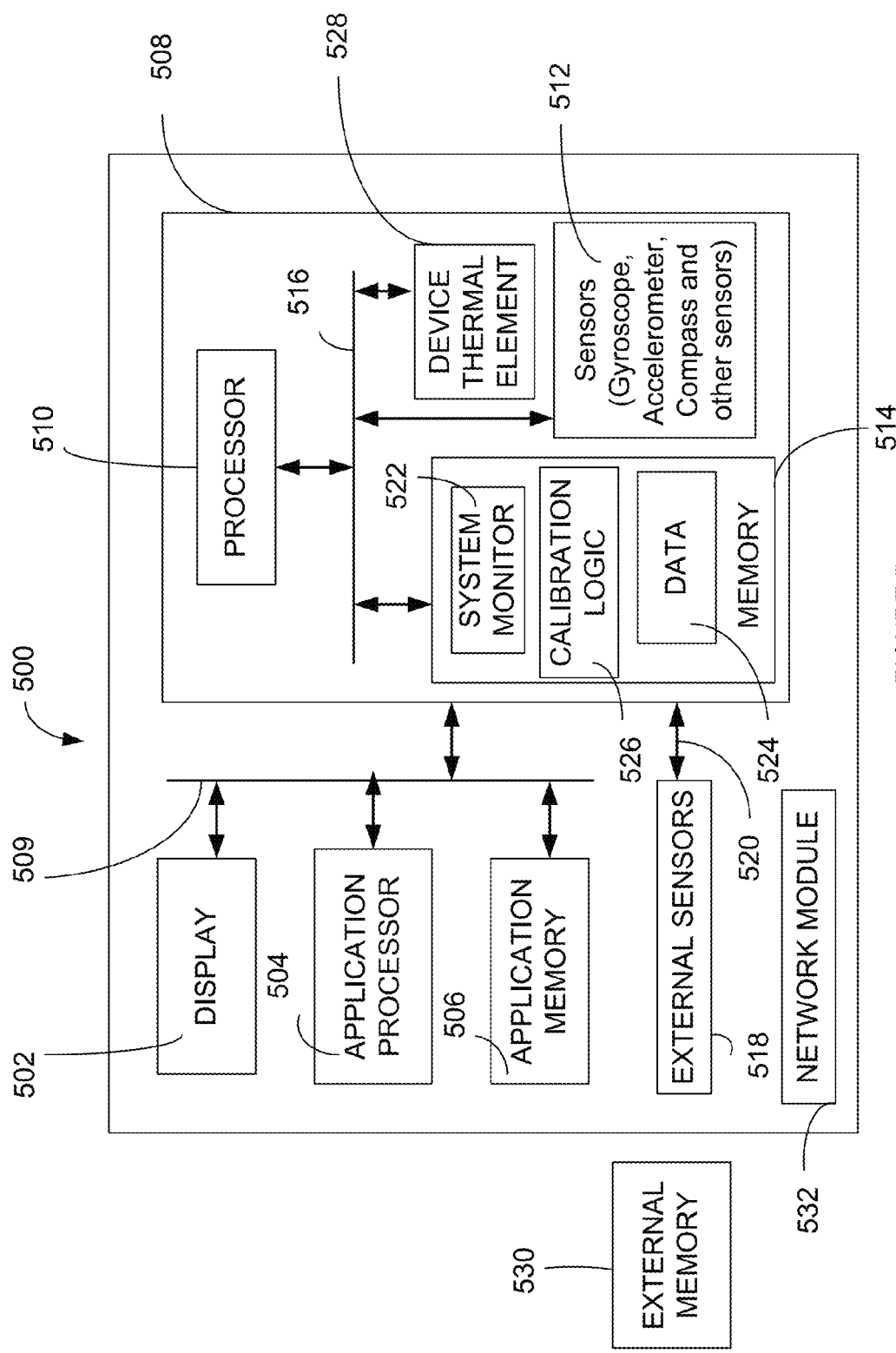
FIG. 5 shows an example host device, according to another aspect of the present disclosure.

Now, referring to FIG. 5, an example host device 500 is described. The host device 500 includes a display 502, an application processor 504, application memory 506 and a motion processing unit 508 (sometimes referred to as MPU), all communicating over a host bus 509. Application processor 504 may be configured to perform various computations and operations involved with the general function of host device 500. Application memory 506 may include programs, drivers or other data that utilize information provided by MPU 508.

In one example, MPU 508 includes a processor 510, one or more sensors 512, a memory 514, all communicating with each other over a MPU bus 516. One or more external sensors 518 may communicate with the MPU 508 over link 520. Sensors 512 may include one or more sensors, such as accelerometers, gyroscopes, magnetometers, pressure sensors, humidity sensors, microphone, temperature sensors and other sensors. External sensors 518 may include one or more sensors, such as accelerometers, gyroscopes, magnetometers, pressure sensors, humidity sensors, microphones, temperature sensors and other sensors. Data portion 524 of memory 514 may be used to store permanent and transient values generated during the operation of the MPU 508. For example, information related to sensors, orientation information, signals generated during the operation, time stamp of various operations performed, offset values, correction values and the like may be stored in the data portion 524 of memory 514.

In some examples, MPU 508 may implement one or more functional modules, for example, a system monitor 522 and calibration logic 526. In some examples, one or more of these functional modules may be implemented in hardware, software or a combination of hardware and software. In some examples, one or more of these functional modules may be implemented as software functions stored in the memory 514, which is executed by the processor 510. In some examples, some of these functional modules may be implemented as software functions stored in the application memory 506, which is executed by the application processor 504. Results of these functions may be reported back to the MPU 508. For example, the calibration logic 526 may be implemented outside of the MPU 508 and the MPU 508 may send a signal to the processor 504 to initiate recalibration.

An offset error or sensitivity error may be estimated using a calibration operation with respect to either or both sensors 512 and external sensors 518. These errors may represent a correction value or an offset value to be added to a sensor measurement. The calibration operation may be performed using processor 510, application processor 504, or any combination thereof. Similarly, instructions related to calibration operation and results of the calibration operation may be stored in any combination of memory 514, application memory 506 or external memory 530. For example, a network module 532 may be configured to communicate with the external memory 530 to store results of the calibration operation and corresponding correction value. Network module 532 may communicate with external memory 530 over a wired or a wireless link. In some examples, external memory 530 may be part of a data store available on a local computing device or a remote computing device, which is accessible over a wired link, wireless link or a combination of wired link and wireless link. In some examples, the correction value or an offset value may change based on a temperature of the sensor. In some examples, the temperature of the sensor may be substantially similar to the temperature of the host device 500.

A device thermal element 528 is disposed in the host device 500. In some examples, device thermal element 528 may be disposed in the MPU 508. In some examples, the device thermal element 528 may be disposed outside the MPU 508. The device thermal element 528 may be similar to thermal element 112 as previously described. The device thermal element 528 may be coupled to the MPU bus 516. Calibration logic 526 may be configured to selectively activate the device thermal element 528 to selectively change the temperature of the sensors 512 and external sensors 518. A temperature sensor may measure the temperature of the sensors 512 and external sensors 518. As previously described, one of the sensors 512 may be configured as a temperature sensor. In one example, measured temperature may be communicated to the calibration logic 526 so that calibration logic 526 may, based on the measured temperature, selectively energize or de-energize the device thermal element 528, to reach a desired temperature.

The system monitor 522 may be configured to gather information regarding a condition of host device 500 from any available source, including processor 510, sensors 512, external sensors 518 and/or application processor 504. Based at least in part on the information, calibration logic may then initiate calibration operation. In one aspect, the information regarding the condition of host device 500 may relate to a physical state of host device 500. For example, system monitor 522 may gather information reflecting the motion currently being experienced by the host device 500.

As known to one skilled in the art, certain motion states facilitates the calibration operation. Notably, a calibration involving a gyroscope may be performed advantageously under a motionless condition. Similarly, calibration of an accelerometer or a gyroscope may benefit from being performed when host device 500 is experiencing a relatively small amount of linear acceleration. Accordingly, system monitor 522 may gather information indicating the motion state of host device 500 and calibration logic 526 may initiate a calibration operation in response to the motion state. As previously described, the calibration logic 526 may selectively energize the device thermal element 528 until a desired temperature is reached, before initiating the calibration operation of a sensor.

Figure 6:
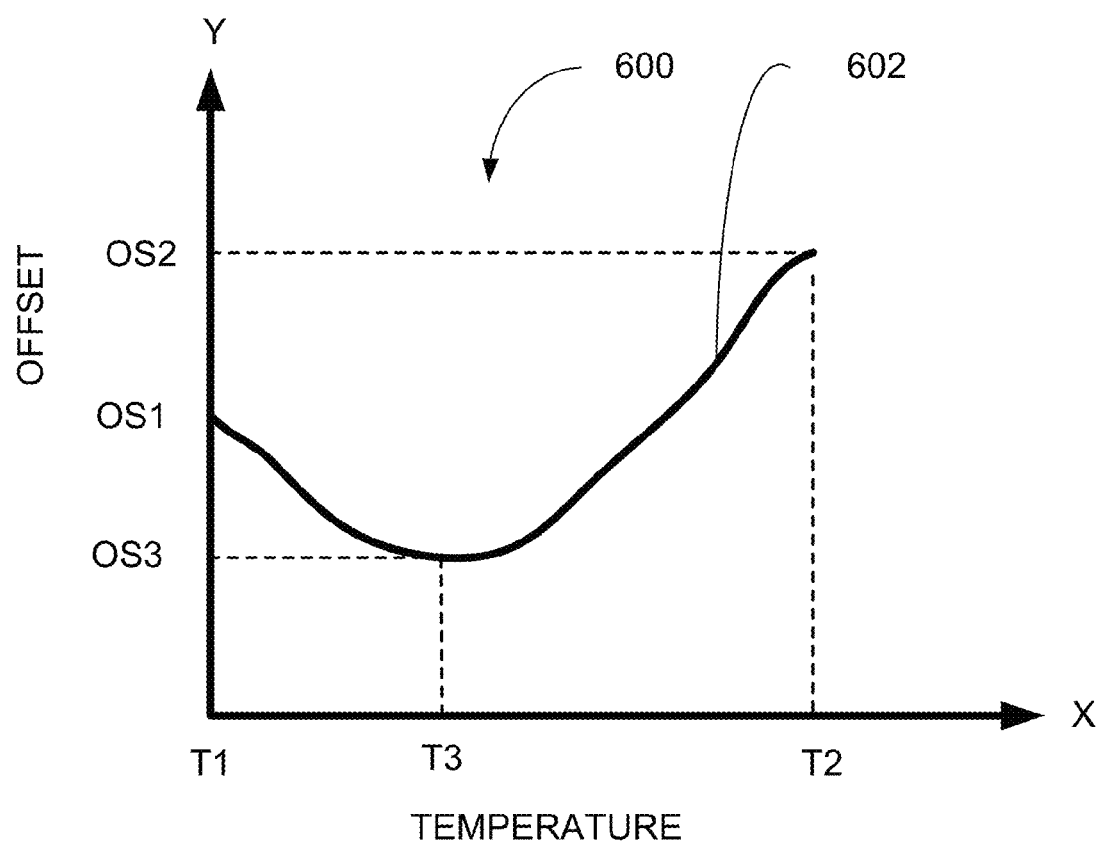
FIG. 6 shows an example graph showing a relationship between an offset and temperature, according to an aspect of the present disclosure.

Now, referring to FIG. 6, an example graph 600 is shown, with X axis depicting temperature and Y axis depicting offset value for a sensor. In this example, a plurality of offset value measurements for a sensor may be performed at various temperatures. For example, a line 602 may be constructed to represent offset value at various temperatures. As an example, at temperature T1, the corresponding offset value may be OS1. Similarly, at temperature T2, the corresponding offset value may be OS2. Similarly, at temperature T3, the offset value may be OS3. As one skilled in the art appreciates, in this example, the offset value OS3 at temperature T3 is the lowest offset value. As one skilled in the art appreciates, offset values for a sensor at various temperatures may be selectively measured and stored in the host device 500. In one example, during normal operation of a sensor, based on a measured temperature, a corresponding offset value may be added to the measured sensor value. In yet another example, the temperature of a sensor may be maintained at a preferred temperature during normal operation, for example, by selectively energizing the device thermal element and adding an offset that corresponds to the preferred temperature to the measured value by the sensor. In one example, a preferred temperature may be an ambient temperature the host device is generally subjected to, for example, based on an environment the host device is operated.

Figure 7:
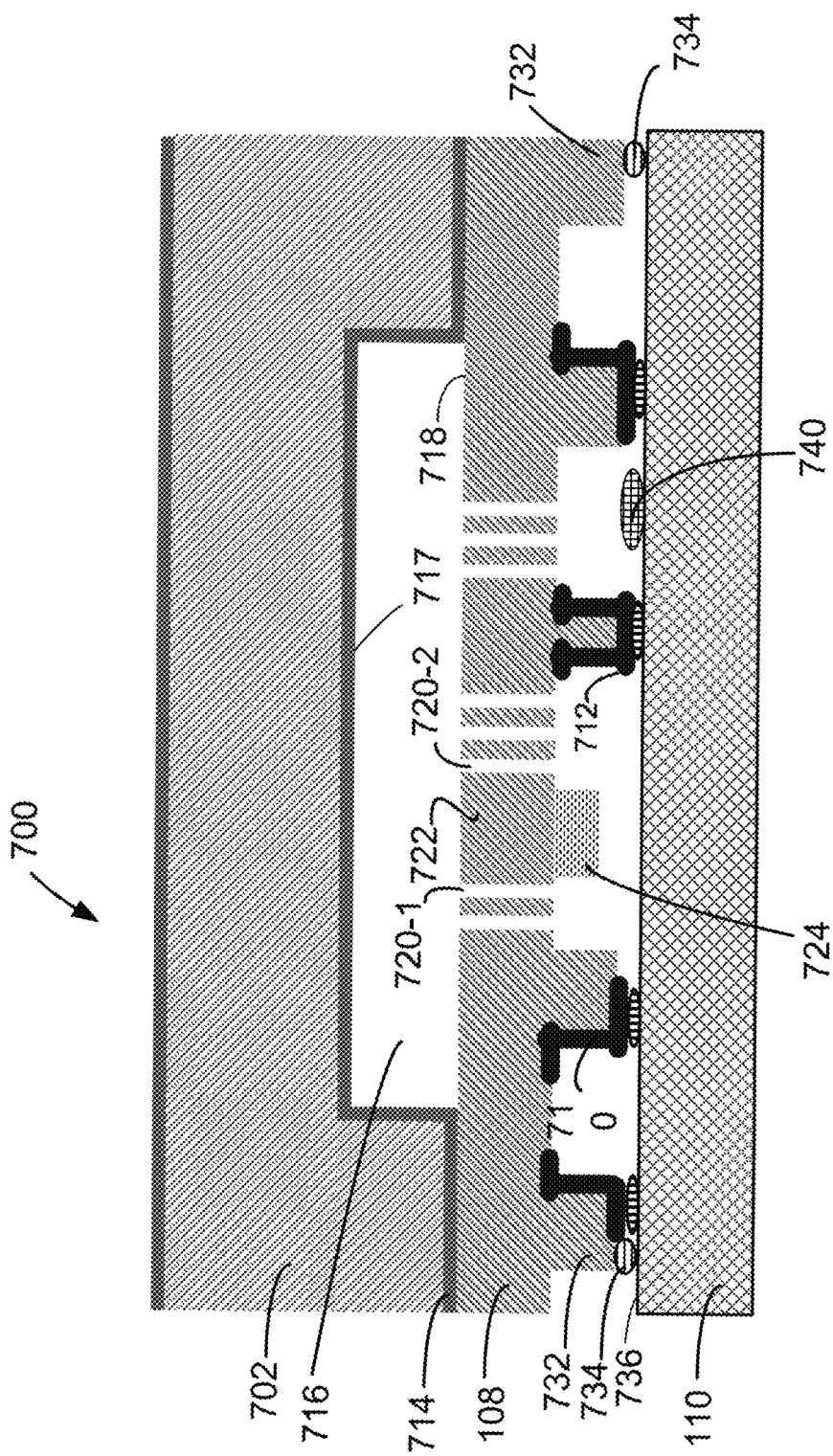
FIG. 7 shows an example first MEMS device, according to an aspect of the present disclosure.

Now, referring to FIG. 7, an example first MEMS device 700 is disclosed. The first MEMS device 700 may be similar to the MEMS device 102 as previously described. The first MEMS device 700 includes a handle layer 702, a device layer 108 and an IC layer 110. One or more sensors are formed on the device layer 108. A fusion bond layer 714 bonds the handle layer 702 to device layer 108, to form an upper cavity 716, defined by the lower side 717 of the handle layer 702 and upper side 718 of the device layer 108.

FIG. 7 also shows trench patterns 720-1 and 720-2 and an actuator 722. The actuator 722 is movable and is attached to at least one spring (not shown). The spring is created by forming a plurality of trench patterns on the device layer 108, for example, using a dry reactive ion etching (DRIE) process. A sensor 724 is formed over the actuator 722.

The device layer 108 includes a standoff 732. The standoff 732 surrounds one or more sensors formed on the device layer 108. A seal ring 734 is disposed between the standoff 732 and a top surface 736 of the IC layer 110 so as to seal the sensor 724 of the first MEMS device 700.

The IC layer 110 in some examples may be a CMOS substrate. One or more electronic circuits (not shown) may be disposed over the IC layer 110. A first terminal 710 and the second terminal 712 may be configured to electrically couple to the electronic circuit disposed over the IC layer 110. A thermal sensor 740 may be disposed over the IC layer 110.

Figure 8:
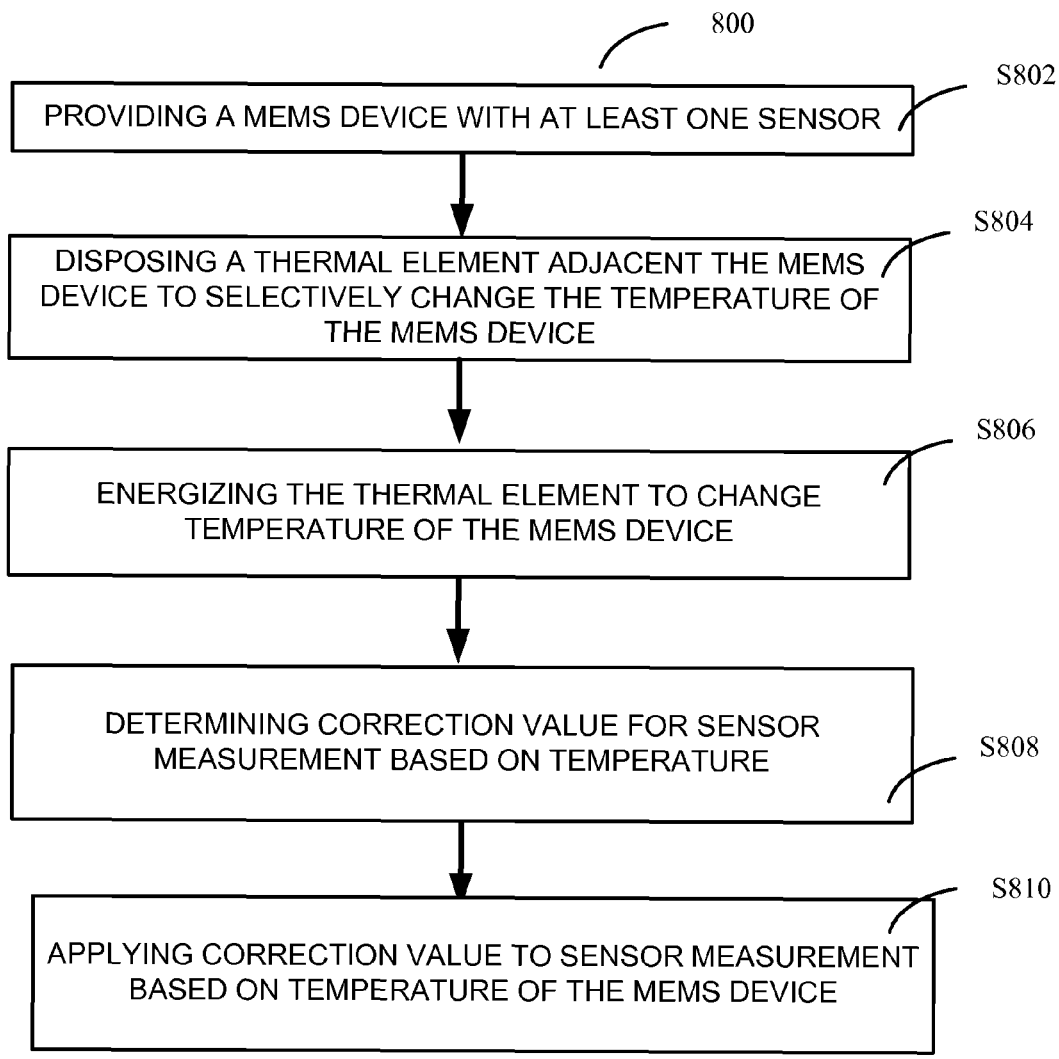
FIG. 8 shows an example flow diagram to determine an offset value for a sensor of a MEMS device, according to one aspect of the present disclosure.

Now, referring to FIG. 8, an example flow diagram 800 will be described. In block S802, a MEMS device is provided. For example, MEMS device 102 is provided. MEMS device 102 may be as described with reference to FIGS. 1 through 3. In some examples, MEMS device 102 may be similar to first MEMS device as described with reference to FIG. 7.

In block S804, a thermal element is disposed adjacent the MEMS device. The thermal element is configured to selectively change the temperature of the MEMS device. For example, a thermal element 112 as described with reference to FIGS. 1 through 3 may be disposed adjacent the MEMS device. Further, the thermal element may be selectively energized to change the temperature of the MEMS device, as described with reference to FIG. 5.

In block S806, the thermal element is energized to change a temperature of the MEMS device. For example, the thermal element may be selectively energized to change the temperature of the MEMS device, as described with reference to FIG. 5.

In block S808, a correction value for the sensor measurement is determined based on the temperature. For example, correction value for the sensor measurement is determined, as described with reference to FIG. 5.

In block S810, correction value to sensor measurement is applied based on temperature of the MEMS device. For example, correction value to sensor measurement is applied based on the temperature of the MEMS device, as described with reference to FIGS. 5 and 6. In some examples, correction value to sensor measurement is applied during normal operation of a host device.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A device, comprising:
a MEMS device with at least one sensor;
a thermal element disposed adjacent the MEMS device, the thermal element configured to selectively adjust a temperature of the MEMS device; and
an adhesive layer disposed adjacent to the MEMS device, the thermal element disposed within the adhesive layer and the adhesive layer attaches the thermal element to the MEMS device.

2. The device of claim 1, wherein a circuit board is disposed adjacent the thermal element and the adhesive layer attaches the MEMS device to the circuit board.

3. The device of claim 2, wherein at least one board thermal spreader is disposed about the circuit board to substantially maintain a uniform temperature about the circuit board.

4. The device of claim 3, wherein the at least one board thermal spreader is disposed within the circuit board.

5. The device of claim 4, wherein the circuit board is a laminate board with at least one thermally conductive layer, the at least one thermally conductive layer configured to be a board thermal spreader.

6. The device of claim 1, wherein a device thermal spreader is disposed over the MEMS device to substantially maintain a uniform temperature about a top surface of the MEMS device and the thermal element is disposed about a bottom surface of the MEMS device.

7. The device of claim 1, wherein the thermal element is configured to selectively heat the MEMS device.

8. The device of claim 1, wherein the thermal element is configured to selectively heat and cool the MEMS device.

9. The device of claim 8, wherein the thermal element is a peltier thermal element.

10. The device of claim 9, wherein the circuit board is disposed adjacent the peltier thermal element and the MEMS device is disposed adjacent the peltier thermal element.

11. The device of claim 10, wherein at least one board thermal spreader is disposed about the circuit board.

12. A device, comprising:
a MEMS device with at least one sensor;
a thermal element disposed adjacent the MEMS device, the thermal element configured to selectively adjust a temperature of the MEMS device;
a circuit board is disposed adjacent the thermal element and the MEMS device is attached to the circuit board,
wherein at least one board thermal spreader is disposed about the circuit board to substantially maintain a uniform temperature about the circuit board;
wherein the at least one board thermal spreader is disposed within the circuit board; and
wherein the circuit board is a laminate board with at least one thermally conductive layer, the at least one thermally conductive layer configured to be a board thermal spreader.

13. The device of claim 12, wherein the thermal element is configured to selectively heat the MEMS device.

14. The device of claim 13, wherein the thermal element is configured to selectively heat and cool the MEMS device.

15. The device of claim 14, wherein the thermal element is a peltier thermal element.

16. The device of claim 15, wherein the circuit board is disposed adjacent the peltier thermal element and the MEMS device is disposed adjacent the peltier thermal element.

17. The device of claim 12, further including:
a processor with a calibration logic configured to
selectively energize the thermal element to adjust a temperature of the MEMS device, adjusted temperature measured by a temperature sensor;
initiate a calibration operation for the sensor to determine a correction value to be applied to the sensor measurement based on the adjusted temperature of the MEMS device; and
store the correction value.

18. The device of claim 17, wherein during an operative state of the sensor, the temperature sensor measures the temperature of the MEMS device and based on the measured temperature of the MEMS device, a corresponding correction value is added to the sensor measurement.

19. The device of claim 17, wherein,
the processor is configured to selectively choose a first correction value and a corresponding first temperature;
the thermal element is selectively energized to selectively maintain the MEMS device temperature at the first temperature; and
the first correction value is added to the sensor measurement.

20. The device of claim 19, wherein the first temperature is selectively chosen by the processor to be an optimum temperature for the device.

21. A device, comprising:
a MEMS device with at least one sensor;
a thermal element disposed adjacent the MEMS device, the thermal element configured to selectively adjust a temperature of the MEMS device;
an adhesive layer disposed adjacent to the MEMS device, the thermal element disposed within the adhesive layer and the adhesive layer attaches the thermal element to the MEMS device; and
a processor with a calibration logic configured to
selectively energize the thermal element to adjust a temperature of the MEMS device, adjusted temperature measured by a temperature sensor;
initiate a calibration operation for the sensor to determine a correction value to be applied to the sensor measurement based on the adjusted temperature of the MEMS device; and
store the correction value.

22. The device of claim 21, wherein during an operative state of the sensor, the temperature sensor measures the temperature of the MEMS device and based on the measured temperature of the MEMS device, a corresponding correction value is added to the sensor measurement.

23. The device of claim 21, wherein
the processor is configured to selectively choose a first correction value and a corresponding first temperature;
the thermal element is selectively energized to selectively maintain the MEMS device temperature at the first temperature; and
the first correction value is added to the sensor measurement.

24. The device of claim 23, wherein the first temperature is selectively chosen by the processor to be an optimum temperature for the device.

25. A method, comprising:
providing a MEMS device with at least one sensor;
disposing a thermal element adjacent the MEMS device;
selectively energizing the thermal element to adjust the temperature of the MEMS device;
initiating a calibration operation for the sensor to determine a correction value to be applied to the sensor measurement based on the temperature; and
storing the correction value, the method further including,
selectively choosing a first correction value and corresponding first temperature;
selectively maintaining the MEMS device temperature at the first temperature by selectively energizing the thermal element; and
applying the first correction value to the sensor measurement.

26. The method of claim 25, wherein the first temperature corresponds to an optimum temperature for the device.

* * * * *